US009343303B2

(12) United States Patent
Wang et al.

(10) Patent No.: US 9,343,303 B2
(45) Date of Patent: May 17, 2016

(54) METHODS OF FORMING LOW-DEFECT STRAIN-RELAXED LAYERS ON LATTICE-MISMATCHED SUBSTRATES AND RELATED SEMICONDUCTOR STRUCTURES AND DEVICES

(71) Applicants: Wei-E Wang, Austin, TX (US); Mark Stephen Rodder, Dallas, TX (US)

(72) Inventors: Wei-E Wang, Austin, TX (US); Mark Stephen Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 14/484,511

(22) Filed: Sep. 12, 2014

(65) Prior Publication Data

US 2015/0270120 A1   Sep. 24, 2015

Related U.S. Application Data

(60) Provisional application No. 61/968,126, filed on Mar. 20, 2014.

(51) Int. Cl.
| | |
|---|---|
| *H01L 21/3063* | (2006.01) |
| *H01L 21/02* | (2006.01) |
| *H01L 21/324* | (2006.01) |
| *H01L 29/165* | (2006.01) |
| *H01L 29/786* | (2006.01) |

(52) U.S. Cl.
CPC ........ *H01L 21/0262* (2013.01); *H01L 21/0245* (2013.01); *H01L 21/02373* (2013.01); *H01L 21/02381* (2013.01); *H01L 21/02513* (2013.01); *H01L 21/02532* (2013.01); *H01L 21/02587* (2013.01); *H01L 21/02658* (2013.01); *H01L 21/3063* (2013.01); *H01L 21/324* (2013.01); *H01L 29/165* (2013.01); *H01L 29/786* (2013.01)

(58) Field of Classification Search
CPC ............... H01L 21/02381; H01L 21/0245; H01L 21/02532
USPC ............... 257/64, 190, E21.129; 438/478
See application file for complete search history.

(56) References Cited

U.S. PATENT DOCUMENTS

| | | | |
|---|---|---|---|
| 5,461,243 A | 10/1995 | Ek et al. | |
| 5,757,024 A | 5/1998 | Fathauer et al. | |
| 5,906,951 A | 5/1999 | Chu et al. | |
| 6,649,492 B2 | 11/2003 | Chu et al. | |
| 6,833,332 B2 | 12/2004 | Christiansen et al. | |
| 6,906,400 B2 | 6/2005 | Delhougne et al. | |
| 7,074,686 B2 | 7/2006 | Bedell et al. | |
| 7,125,458 B2 | 10/2006 | Bedell et al. | |

(Continued)

OTHER PUBLICATIONS

Capellini et al. "Strain relaxation in high Ge content SiGe layers deposited on Si", *Journal of Applied Physics*, 107:063504, (2010).

(Continued)

*Primary Examiner* — Cuong Q Nguyen
*Assistant Examiner* — Tong-Ho Kim
(74) *Attorney, Agent, or Firm* — Myers Bigel & Sibley, P.A.

(57) ABSTRACT

Methods of forming strain-relaxing semiconductor layers are provided in which a porous region is formed in a surface of a semiconductor substrate. A first semiconductor layer that is lattice-matched with the semiconductor substrate is formed on the porous region. A second semiconductor layer is formed on the first semiconductor layer, the second semiconductor layer being a strained layer as formed. The second semiconductor layer is then relaxed.

19 Claims, 5 Drawing Sheets

(56) References Cited

U.S. PATENT DOCUMENTS

| | | | |
|---|---|---|---|
| 7,235,812 | B2 | 6/2007 | Chu et al. |
| 7,259,084 | B2 | 8/2007 | Chang et al. |
| 7,514,372 | B2 | 4/2009 | Arena et al. |
| 7,648,853 | B2 | 1/2010 | Bauer |
| 7,855,127 | B2 | 12/2010 | Akiyama et al. |
| 7,902,046 | B2 | 3/2011 | Kuo et al. |
| 8,409,974 | B2 | 4/2013 | Cohen et al. |
| 8,415,718 | B2 | 4/2013 | Xu |
| 2001/0048119 | A1* | 12/2001 | Mizuno et al. ............... 257/192 |
| 2002/0146892 | A1* | 10/2002 | Notsu et al. .................. 438/455 |
| 2005/0221591 | A1* | 10/2005 | Bedell et al. ................. 438/479 |
| 2012/0115310 | A1 | 5/2012 | Miu et al. |
| 2012/0319211 | A1 | 12/2012 | van Dal et al. |

OTHER PUBLICATIONS

Kim et al. "a method for fabricating dislocation-free tensile-strained SiGe films via the oxidation of porous Si substrates", *Applied Physics Letters*, 91:252108 (2007).

Myronov et al. "Control of epilayer thickness during epitaxial growth of high Ge content strained Ge/SiGe multilayers by RP-CVD", *Journal of Crystal Growth*, 318:337-340, (2011).

Myronov et al. Very thin, high Ge content $Si_{0.3}Ge_{0.7}$ relaxed buffer grown by MBE on SOI(001) substrate, *Journal of Crystal Growth*, 301-301, (2007) 315-318.

Shah et al. "Reverse graded strain relaxed SiGe buffers for CMOS and optoelectronic integration", *Thin Solid Films*, 520:3227-3231, (2012).

Vincent et al. "Selective Growth of Strained Ge Channel on Relaxed SiGe Buffer in Shallow Trench Isolation for High Mobility Ge Planar and Fin p-FET", *ECS Transactions*, 50(9), 39-45 (2012).

Dunstan, D. J., et al., "Geometrical Theory of Critical Thickness and Relaxation Instrained-Layer Growth," J. Appl. Phys. 70 (6), Sep. 15, 1991, pp. 3038-3045.

Malta, D. P., et al. "Low-Defect-Density Germanium on Silicon Obtained by a Novel Growth Phenomenon," Appl, Phys. Lett. 60(7), Feb. 17, 1992, pp. 844-846.

Douglas J. Paul, "Si/SiGe Heterostructures: From Material and Physics to Devices and Circuits" Semiconductors Science and Technlogy, Semicond. Sci, Technol. 19, Sep. 15, 2004, pp. R75-R105.

Powell, A. R., et al. "New Approach to the Growth of Low Dislocation Relaxed SiGe Material," Appl. Phys. Lett. 64 (14), Apr. 4, 1994, pp. 1856-1858.

Takagi Shinichi, et al., "Carrier-Transport-Enhanced CMOS Using New Channel Materials and Structures," ISDRS 2007, Dec. 12-14, 2007—http://www.ede.umd.edu/ISDRS.

Speck, J.S. et al., "Scaling Laws for the Reduction of Threading Dislocation Densities in Homogeneous Buffer Layers," J. App. Phys. 80 (7), American Institute of Physics, Oct. 1, 1996, pp. 3808-3816.

Wang, Zhao et al., "Diameter Dependence of SiGe Nanowire Thermal Conductivity," Appl. Phys. Lett. 97, 101903 (2010).

Hartmann, J.M., et al. "Critical Thickness for Plastic Relaxation of SiGe on Si (001) Revisited," Journal of Applied Physics 110, 083529 (2011).

Imai, Kazuo, "A New Dielectric Isolation Method Using Porous Silicon," Solid-State Electronics, vol. 24, pp. 159-164.

Tsao, Sylvia S., "Porous Silicon techniques for SOI Structures," IEEE Circuits and Devices Magazine, Nov. 1987, pp. 3-7.

Y. Watanabe et al., "Formation and Properties of Porous Silicon and its Application," J. Electrochem. Soc. 122, 1351 (1975).

\* cited by examiner

METHODS OF FORMING LOW-DEFECT STRAIN-RELAXED LAYERS ON LATTICE-MISMATCHED SUBSTRATES AND RELATED SEMICONDUCTOR STRUCTURES AND DEVICES

CROSS-REFERENCE TO RELATED APPLICATION

The present application claims priority under 35 U.S.C. §119 to U.S. Provisional Application Ser. No. 61/968,126, filed on Mar. 20, 2014, the entire content of which is incorporated herein by reference as if set forth in its entirety.

FIELD

The inventive concepts generally relate to semiconductor devices and, more particularly, to methods of forming strain-relaxed layers on lattice-mismatched semiconductor substrates and semiconductor devices including such strain-relaxed layers.

BACKGROUND

There are a number of applications where it may be desirable to grow a strained semiconductor layer. For example, strained silicon layers are routinely used in high performance complementary metal oxide semiconductor (CMOS) devices because strained semiconductor layers may exhibit higher carrier mobility, and hence transistors having channels formed in such strained silicon layers may exhibit higher switching speeds. A strained silicon layer may be formed, for example, by growing a relatively thin silicon layer on a thicker silicon-germanium layer that is often referred to as a silicon-germanium "buffer" layer.

FIG. 1 illustrates a strained silicon layer formed according to a conventional technique. Referring to FIG. 1, pursuant to this conventional technique, a graded silicon-germanium ($Si_{1-x}Ge_x$) layer 20 is epitaxially grown on a bulk silicon substrate 10. The value of x may be very low (or zero) at the interface between the graded $Si_{1-x}Ge_x$ layer 20 and the bulk silicon substrate 10, and x may increase with increasing distance from the substrate 10. Because of the lattice-mismatch between the silicon substrate 10 and the graded $Si_{1-x}Ge_x$ layer 20, the $Si_{1-x}Ge_x$ layer 20 may be under strain as grown. After the graded $Si_{1-x}Ge_x$ layer 20 is grown beyond a certain thickness, misfit dislocations 22 may be generated at the interface between the bulk silicon substrate 10 and the graded $Si_{1-x}Ge_x$ layer 20. A pair of threading dislocations 24 may extend from each misfit dislocation 22 up through the graded $Si_{1-x}Ge_x$ layer 20 toward the surface of the graded $Si_{1-x}Ge_x$ layer 20. Techniques may be used during growth that tend to increase the length of the misfit dislocations 22, which may help limit the number of threading dislocations 24 that are formed. The formation of these dislocations 22, 24 may act to relax the graded $Si_{1-x}Ge_x$ layer 20. The graded $Si_{1-x}Ge_x$ layer 20 may then be further relaxed by a thermal anneal.

A silicon layer 30 may then be grown on the graded $Si_{1-x}Ge_x$ layer 20. Because of lattice mismatch between the relaxed, graded $Si_{1-x}Ge_x$ layer 20 and the silicon layer 30, the silicon layer 30 may be under strain as grown. Unfortunately, however, threading dislocations 24 that reach the upper surface of the graded $Si_{1-x}Ge_x$ layer 20 may cause dislocations or other defects in the strained silicon layer 30. These defects/dislocations 24 in the strained silicon layer 30 may negatively affect the performance of any semiconductor device formed in the silicon layer 30. While the threading dislocation density at the top surface of the graded $Si_{1-x}Ge_x$ layer 20 may generally be decreased by increasing the thickness of the graded $Si_{1-x}Ge_x$ layer 20, the growth of thicker $Si_{1-x}Ge_x$ layer 20 may significantly increases the required growth time and may also result in other problems such as, for example, an increased incidence of semiconductor wafers becoming unusable due to particles that fall into the wafer during epitaxial growth. Moreover, to reduce threading dislocation levels to $1 \times 10^6/cm^2$ or less, it may be necessary to grow the graded $Si_{1-x}Ge_x$ layer 20 to a thickness of tens or hundreds of microns. The growth times and material costs associated with the growth of such thick layers may be prohibitively expensive in many applications.

In another approach, strain-relaxed $Si_{1-x}Ge_x$ layers have been formed by growing $Si_{1-x}Ge_x$ layers on a silicon-on-insulator substrates. Prior to the growth of such an $Si_{1-x}Ge_x$ layer, the silicon-on-insulator substrate is etched or subject to a grinding operation so that only a 50 nm thick silicon layer remains on the insulator of the silicon-on-insulator substrate. After the layer is grown, it is then relaxed via a thermal annealing process. However, this process requires a more expensive silicon-on-insulator substrate and has only been shown to work with relatively low germanium concentration $Si_{1-x}Ge_x$ layers (i.e., x=0.15).

SUMMARY

Methods of forming strain-relaxing semiconductor layers are provided in which a porous region is formed in a surface of a semiconductor substrate. A first semiconductor layer that is lattice-matched with the semiconductor substrate is formed on the porous region. A second strained semiconductor layer is formed on the first semiconductor layer. The second semiconductor layer is then relaxed.

In some embodiments, a third semiconductor layer may be formed on the relaxed second semiconductor layer. This third semiconductor layer may be a strained layer as formed. The third semiconductor layer may then be relaxed to provide a strain-relaxed semiconductor layer.

In some embodiments, the porous region may be formed in the surface of the semiconductor substrate by wet etching a top surface of the semiconductor substrate using a wet etchant with an electrical potential applied between the semiconductor substrate and the wet etchant.

In some embodiments, before the second semiconductor layer is relaxed, the first semiconductor layer may be under tensile stress and the second semiconductor layer may be under compressive stress.

In some embodiments, the first semiconductor layer may have a thickness of less than 20 nm.

In some embodiments, the first semiconductor layer may only be weakly bonded to the semiconductor substrate so that the first semiconductor layer may move with respect to the semiconductor substrate when a tensile stress is applied to the first semiconductor layer.

The first semiconductor layer may be formed directly on the porous region in the surface of the semiconductor substrate, and the second semiconductor layer may be formed directly on the first semiconductor layer.

In some embodiments, the semiconductor substrate may be a silicon substrate, the first semiconductor layer may be a silicon layer, and the second semiconductor layer may be a silicon-germanium layer having a first germanium concentration, and the third semiconductor layer may be a second silicon-germanium layer having a second germanium concentration that exceeds the first germanium concentration.

In some embodiments, a germanium concentration of the second silicon-germanium layer may exceed 75 percent (or 85 percent) and a threading dislocation density in the second silicon-germanium layer may be less than about $1 \times 10^5/cm^2$.

In some embodiments, a total thickness of the silicon layer, the first silicon-germanium layer and the second silicon-germanium layer may be less than 75 nm.

In some embodiments, the second semiconductor layer may be a III-V compound semiconductor layer.

In some embodiments, a third fourth semiconductor layer may be formed on the second silicon-germanium layer and a semiconductor device may be formed at least partly in or on the fourth semiconductor layer.

Pursuant to further embodiments of the inventive concepts, methods of forming a strain-relaxed semiconductor layer are provided in which a first semiconductor layer is formed on top of a compliant region of a semiconductor substrate that is lattice-matched with the first semiconductor layer so that the first semiconductor layer is only weakly bonded to the compliant region of the semiconductor substrate and may move laterally on the top surface of the compliant region of the semiconductor substrate. A second semiconductor layer that is lattice-mismatched with the first semiconductor layer is formed on the first semiconductor layer. A relaxation process is performed on the second semiconductor layer that generates threading dislocations in the first semiconductor layer while leaving the second semiconductor layer substantially free of threading dislocations.

In some embodiments, a third semiconductor layer that is lattice-mismatched with the second semiconductor layer may be formed on the second semiconductor layer, and a relaxation process may be performed on the third semiconductor layer that generates threading dislocations in the second semiconductor layer while leaving the third semiconductor layer substantially free of threading dislocations.

In some embodiments, the first semiconductor layer may be under tensile stress prior to relaxation and the second semiconductor layer may be under compressive stress prior to relaxation.

In some embodiments, the first semiconductor layer may be a silicon layer having a first thickness, the second semiconductor layer may be a silicon-germanium layer and that has a first germanium concentration and that has a second thickness that exceeds the first thickness, and the third semiconductor layer may be a second silicon-germanium layer that has a second germanium concentration that exceeds the first germanium concentration and that has a third thickness that exceeds the second thickness.

In some embodiments, a porous region is formed in a top surface of a semiconductor substrate and the semiconductor substrate is then heated to close at least some of the surface pores while leaving the interior of the porous region porous to convert the a region of the semiconductor substrate into the compliant region of the semiconductor substrate, and then the first semiconductor layer may be epitaxially grown on the porous region by chemical vapor deposition.

In some embodiments, the first and second semiconductor layers may each have a thickness of less than 25 nm.

In some embodiments, the compliant region of the semiconductor substrate may be a porous region in a top surface of a silicon substrate, the first semiconductor layer may be a silicon layer, the second semiconductor layer may be a first silicon-germanium layer having a first germanium concentration, and the third semiconductor layer may be a second silicon-germanium layer having a second germanium concentration that exceeds the first germanium concentration.

In some embodiments, a germanium concentration of the second silicon-germanium layer may exceed 75 percent and a threading dislocation density in the second silicon-germanium layer may be less than about $1 \times 10^5/cm^2$.

In some embodiments, a total thickness of the silicon layer, the first silicon-germanium layer and the second silicon-germanium layer may be less than 75 nm.

In some embodiments, the porous region may have a porosity of at least 30%.

In some embodiments, the relaxation process may be a thermal anneal.

In some embodiments, a strained fourth semiconductor layer may be formed on the third semiconductor layer and a semiconductor device may be formed at least partly in or on the fourth semiconductor layer.

Pursuant to still further embodiments of the present invention, methods of forming a semiconductor device are provided in which a porous region is formed in a surface of a silicon substrate. A silicon layer is formed on the porous region in the surface of the silicon substrate. A first silicon-germanium layer that has a first germanium concentration is formed on the silicon layer. The first silicon-germanium layer is then relaxed. A second silicon-germanium layer that has a second germanium concentration that is higher than the first germanium concentration is then formed on the relaxed first silicon-germanium layer, the second silicon-germanium layer being a strained layer as formed. Then, the second silicon-germanium layer is relaxed. A semiconductor layer is formed on the second silicon-germanium layer. Finally, the semiconductor device is formed at least partly in the semiconductor layer.

In some embodiments, forming the porous region in the surface of the silicon substrate may involve wet etching a top surface of the silicon substrate using a wet etchant with an electrical potential applied between the silicon substrate and the wet etchant. The method may also include annealing the silicon substrate to close at least some of the pores in a top surface of the porous region prior to forming the first silicon-germanium layer.

In some embodiments, the first semiconductor layer may have a thickness of less than 20 nm, and a total thickness of the silicon layer, the first silicon-germanium layer and the second silicon-germanium layer may be less than 75 nm.

In some embodiments, the silicon layer may only be weakly bonded to the silicon substrate so that the silicon layer may move with respect to the silicon substrate when a tensile stress is applied to the silicon layer.

In some embodiments, a germanium concentration of the second silicon-germanium layer may exceed 75 percent and a threading dislocation density in the second silicon-germanium layer may be less than about $1 \times 10^5/cm^2$.

Pursuant to still further embodiments of the inventive concepts, semiconductor structures are provided that include a silicon substrate, a porous silicon region in a top surface of the silicon substrate, a silicon layer on a top surface of the porous silicon region, a first silicon-germanium layer having a first germanium concentration on the top surface of the silicon layer, and a strain-relaxed second silicon-germanium layer having a second germanium concentration that exceeds the first germanium concentration on the top surface of the first silicon-germanium layer.

In some embodiments, the porous silicon region may have a porosity of at least 30%.

In some embodiments, a first plurality of misfit dislocations may be present at the interface between the silicon layer and the first silicon-germanium layer, and the silicon layer may have a threading dislocation density of at least $1 \times 10^6/$ cm², and a second plurality of misfit dislocations may be present at the interface between the first silicon-germanium layer and the second silicon-germanium layer, and the first silicon-germanium layer may have a threading dislocation density of at least $1 \times 10^6/cm^2$, and the second silicon germanium layer may have a threading dislocation density of less than $1 \times 10^5/cm^2$.

In some embodiments, a germanium concentration of the second silicon-germanium layer may exceed 75 percent.

In some embodiments, a total thickness of the silicon layer, the first silicon-germanium layer and the second silicon-germanium layer may be less than 75 nm.

In some embodiments, a first plurality of misfit dislocations may be present at the interface between the silicon layer and the first silicon-germanium layer, and a plurality of threading dislocations may extend downwardly from the misfit dislocations into the silicon layer.

In some embodiments, the silicon layer may have a thickness of less than 20 nm, and the silicon layer may only be weakly bonded to the silicon substrate so that the silicon layer may move with respect to the silicon substrate when a tensile stress is applied to the silicon layer.

In some embodiments, the silicon layer may have a first thickness, the first silicon-germanium layer may have a second thickness that exceeds the first thickness, and the second silicon-germanium layer may have a third thickness that exceeds the second thickness.

DETAILED DESCRIPTION

Figure 1:
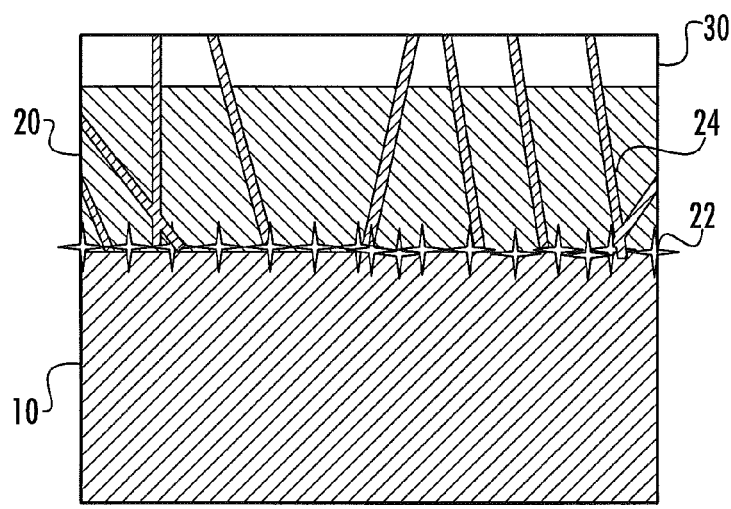
FIG. 1 is a sectional diagram that schematically illustrates a conventional method of forming a strained silicon layer on a strain-relaxed silicon-germanium layer.

Pursuant to embodiments of the inventive concepts, methods of forming a strain-relaxed layer on a semiconductor substrate are provided. The stain-relaxed layer may be, for example, a high germanium concentration silicon-germanium layer, and the semiconductor substrate may be a bulk silicon substrate. In some embodiments of these methods, a porous region may be formed in a top surface of the bulk silicon substrate by performing, for example, a wet etch using hydrofluoric acid. A heat treatment may then be performed to close the pores in the top surface of the porous region of the silicon substrate. A thin silicon layer may then be epitaxially grown on the top surface of the porous region. This thin silicon layer may serve as a first sacrificial layer. Because of the porous region in the upper portion of the bulk silicon substrate, the bonds between the thin silicon epitaxial layer and the top surface of the silicon substrate may be weaker than normal, so that the top surface of the substrate is somewhat "slippery" or compliant with respect to the thin silicon layer.

A first silicon-germanium layer having a first germanium concentration may then be epitaxially grown on the silicon layer. The first silicon-germanium layer may be thin (e.g., 10-20 nm thick). The first silicon-germanium layer may have a relatively high germanium concentration such as, for example, a germanium concentration of 50%. In some embodiments, the first silicon-germanium layer and the underlying silicon layer may be fully strained as grown and may be substantially free of defects as grown. A thermal annealing process may then be performed to relax the silicon layer and the first silicon-germanium layer. As these layers relax, misfit dislocations will form along the interface between the silicon layer and the first silicon-germanium layer, and threading dislocations may propagate through the silicon layer, but the first silicon-germanium layer may exhibit lower levels of threading dislocations or even be substantially free of threading dislocations.

In some embodiments, a second silicon-germanium layer having a second germanium concentration that is higher than the first germanium concentration may then be epitaxially grown on the first silicon-germanium layer. As grown, the second silicon-germanium layer may be fully strained, and the underlying first silicon-germanium layer will also be strained during the epitaxial growth process. A thermal annealing process may then be performed to relax the first and second silicon-germanium layers. As these layers relax, misfit dislocations will form along the interface between the first and second silicon-germanium layers, and threading dislocations may propagate through the first silicon-germanium layer, but the second silicon-germanium layer may exhibit lower levels of defects or even be substantially defect free. The second silicon-germanium layer may then be used as a seed layer for growth of, for example, additional semiconductor material which can be used as active areas of semiconductor devices including, for instance, an epitaxially grown germanium or silicon-germanium fin for a FIN-FET transistor or strained silicon channel layers. The additional semiconductor material can also be used as donor wafer material for formation of active areas of semiconductor devices on an insulating layer overlying a semiconductor substrate.

The strain-relaxed silicon-germanium layers fabricated according to embodiments of the inventive concepts may be relatively thin layers (e.g., the series of layers that are grown may have a total thickness above a top surface of the silicon substrate of less than 50-100 nm in some embodiments) and may have reduced defect densities (e.g., threading dislocation densities of $1 \times 10^5/cm^2$ or even less may be possible). Moreover, the strain-relaxed silicon-germanium layers according to embodiments of the inventive concepts may be grown to have very high germanium concentration such as germanium concentrations of 0.9 or even 1.0 (i.e., pure germanium), while still exhibiting relatively low threading dislocation densities. Additionally, the strain-relaxed silicon-germanium layers according to embodiments of the inventive concepts may be formed cost effectively on conventional bulk silicon substrates using conventional chemical vapor deposition epitaxial growth processes that are appropriate for high volume manufacturing.

While the above-described example embodiments of the inventive concepts involve growing a strain-relaxed silicon-germanium layer on a silicon substrate, it will be appreciated that the techniques disclosed herein may be used in a wide variety of material systems. For example, in other embodiments, a strain-relaxed III-V compound semiconductor layer may be grown on a lattice mismatched substrate such as a sapphire, silicon or silicon carbide substrate.

Methods and semiconductor devices according to embodiments of the inventive concepts will now be discussed in more detail with reference to the attached drawings, in which example embodiments of these methods and semiconductor devices and intermediate structures are shown.

Figure 2:
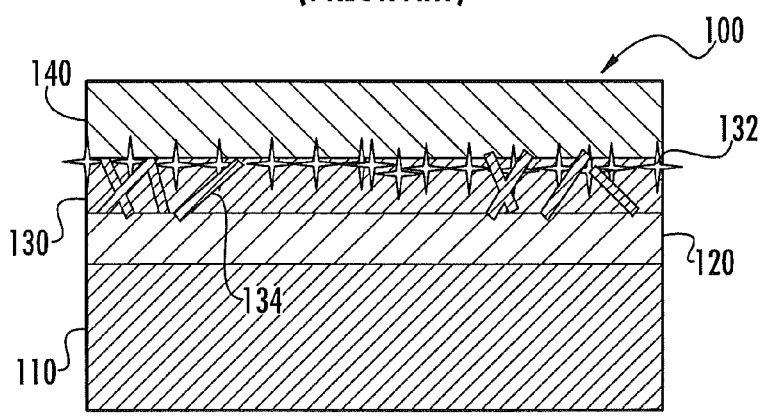
FIG. 2 is a sectional diagram that schematically illustrates a semiconductor structure that includes a strain-relaxed layer according to certain embodiments of the inventive concepts.

FIG. 2 is a sectional diagram that schematically illustrates a semiconductor structure 100 that includes a strain-relaxed layer according to certain embodiments of the inventive concepts. The semiconductor structure may comprise, for example, a semiconductor wafer or a portion of such a semiconductor wafer.

As shown in FIG. 2, the semiconductor structure 100 includes a silicon substrate 110 such as, for example, a bulk silicon substrate or a thick silicon epitaxial layer. The silicon substrate 110 may comprise a p-type silicon substrate or an n-type silicon substrate, and may or may not be doped with impurities. A top surface of the silicon substrate 110 may comprise a porous region 120. The porous region 120 may comprise the entirety of the top surface of the silicon substrate 110 or may be one or more discrete porous regions that are formed in selected locations in the top surface of the silicon substrate 110. The pores on the uppermost surface of porous region 120 may be closed by an appropriate treatment so that the porous region 120 may serve as a good seed layer during a subsequent epitaxial growth process. A thin silicon layer 130 is provided on a top surface of the porous region 120. Finally, a silicon-germanium layer 140 is provided on a top surface of the thin silicon layer 130.

The silicon-germanium layer 140 may be a strain-relaxed silicon-germanium layer 140. A plurality of misfit dislocations 132 may be formed in the semiconductor structure 100, primarily along the interface between the thin silicon layer 130 and the silicon-germanium layer 140. Threading dislocations 134 may extend from the misfit dislocations 132. As shown in FIG. 2, the threading dislocations 134 may primarily extend downwardly from the misfit dislocations 132 to extend through the thin silicon layer 130. The threading dislocations 134 may only spread through the silicon layer 130 and not into the porous region 120 of the silicon substrate 110. The silicon-germanium layer 140 may have a low threading dislocation density or may be substantially free of threading dislocations 134.

In some embodiments, the silicon layer 130 may be a thin silicon layer 130 having a thickness of, for example, less than 25 nm. In some embodiments the silicon layer 130 may have a thickness of less than 15 nm such as, for example, a thickness of about 10 nm. The silicon layer 130 may comprise a sacrificial layer that is prone to receive the threading dislocations 134 that extend from the misfit dislocations 132 that are formed at the interface between the lattice mismatched silicon layer 130 and the silicon-germanium layer 140.

The silicon-germanium layer 140 may have a variety of different germanium concentrations. The germanium concentration may be selected to be at a level so that the silicon layer 130 can relax the silicon-germanium layer 140. Thus, in some cases this may set a practical upper limit on the germanium concentration. The silicon-germanium layer 140 may, in some embodiments, comprise a graded layer, although more typically the silicon-germanium layer 140 will have a constant germanium concentration. If the silicon-germanium layer 140 is a graded layer, the average germanium concentration of the layer is considered to be the germanium concentration of the layer.

The thickness of the silicon-germanium layer 140 may be selected to meet multiple criteria in some embodiments. For example, the silicon-germanium layer 140 may have a thickness that is sufficient to store enough strain energy to enable relaxation of the underlying silicon layer 130 during a subsequent relaxation process. Additionally, the thickness of the silicon-germanium layer 140 may be close to a "critical thickness" of the silicon-germanium layer 140. The "critical thickness" refers to a thickness of the silicon-germanium layer 140 which is sufficiently small that the layer will be elastically strained, but will be stable meaning that the layer will remain elastically strained even if heated to very high temperatures. The critical thickness for the silicon-germanium layer 140 is a function of, for example, the germanium concentration of the layer. The thickness of the silicon-germanium layer 140 may also be at or near a maximum meta-stable thickness for the silicon-germanium layer 140. The meta-stable thickness refers to a range of thicknesses for a layer that is grown on an underlying lattice-mismatched layer that are thicker than critical thickness up to a thickness at which relaxation will occur during growth. In other words, for thicknesses greater than the maximum meta-stable thickness, the layer will be relaxed with dislocations as grown since the strain energy is greater than the lattice can handle. The range of layer thicknesses between the critical thickness and the maximum meta-stable thickness is referred to as the meta-stable region. Layers having thicknesses in the meta-stable region are strained as grown, but may relax (and form dislocations) in response to, for example, a thermal anneal. The maximum meta-stable thickness for the silicon-germanium layer 140 may depend upon, for example, the germanium concentration of the layer and the temperature at which the layer is grown. By forming the silicon-germanium layer 140 to a thickness in the meta-stable region the silicon-germanium layer 140 may be relatively low defect or defect-free as grown, and may exert a tensile stress onto the underlying silicon layer 130 that strains the silicon layer 130 so that the threading dislocations form in the silicon layer 130 instead of in the silicon-germanium layer 140. In some embodiments, the silicon-germanium layer 140 may have a thickness of, for example, about 10 nm to about 20 nm. The silicon-germanium layer 140 may be thicker than the silicon layer 130.

The silicon-germanium layer 140 may be used, for example, as a growth surface for additional semiconductor material which can be used as active areas of semiconductor devices including, for instance, a strained silicon layer (not shown). In other cases, the silicon-germanium layer 140 may be used as a seed surface for the growth of additional semiconductor material which can be used as active areas of semiconductor devices including a germanium fin for a FIN-FET transistor. A wide variety of other uses are possible. Additionally, as will be explained below with respect to FIG. 3, the silicon-germanium layer 140 may be used as a sacrificial layer for the growth of a higher concentration silicon-germanium layer on a top surface thereof.

Figure 3:
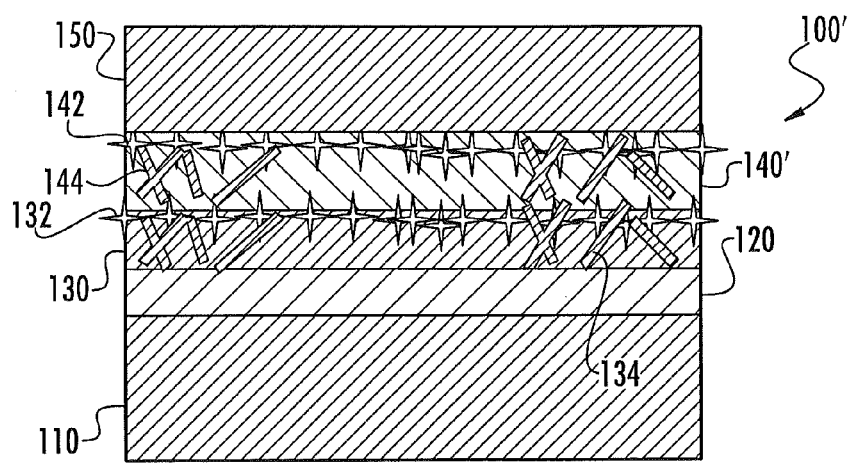
FIG. 3 is a sectional diagram that schematically illustrates a semiconductor structure that includes a strain-relaxed layer according to further embodiments of the inventive concepts.

FIG. 3 is a sectional diagram that schematically illustrates a semiconductor device 100' that includes a strain-relaxed layer according to further embodiments of the inventive concepts.

As shown in FIG. 3, the semiconductor device 100' includes the silicon substrate 110, the porous region 120 and the silicon layer 130 of the semiconductor device 100 discussed above with reference to FIG. 2. The semiconductor device 100' further includes a silicon-germanium layer 140'. The silicon-germanium layer 140' may be similar to the silicon-germanium layer 140 discussed above. However, the silicon-germanium layer 140' includes a plurality of misfit dislocations 142 that are formed at an interface between the silicon germanium layer 140' and a second silicon-germanium layer 150 that is formed thereon, as well as a plurality of threading dislocations 144 that extend from the misfit dislocations 142 downwardly into the first silicon-germanium layer 140'.

The second silicon-germanium layer 150 may have a higher germanium concentration than the first silicon-germanium layer 140'. For example, in some embodiments, the second silicon-germanium layer 150 may have a germanium concentration of 90% or higher. In some embodiments, the second silicon-germanium layer 150 may be replaced with a pure germanium layer. In some embodiments, the second silicon-germanium layer 150 may be a relatively thin layer having a thickness of, for example, less than 50 nm. In some embodiments the second silicon-germanium layer 150 may have a thickness of between, for example, about 20 nm to about 40 nm. The second silicon-germanium layer 150 may be thicker than the first silicon-germanium layer 140'. The second silicon-germanium layer 150 may have a low threading dislocation density or may be substantially free of threading dislocations.

Figure 4:
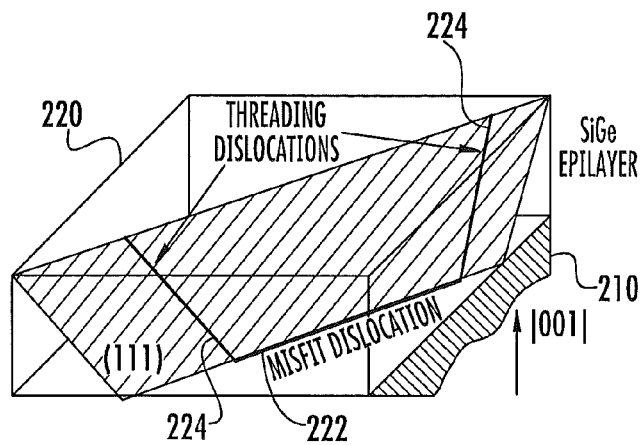
FIG. 4 is a schematic diagram illustrating the formation of misfit and threading dislocations that may be generated in sacrificial layers that are formed pursuant to the techniques according to embodiments of the inventive concepts.

FIG. 4 is a schematic perspective diagram illustrating how misfit and threading dislocations may form when a strained silicon-germanium layer that is grown on an underlying silicon layer or substrate is relaxed. As shown in FIG. 4, a silicon-germanium epitaxial layer 220 may be grown on a bulk silicon substrate 210. The silicon-germanium layer 220 is lattice mismatched with the underlying silicon substrate, and hence the silicon-germanium layer 220 will be strained as grown. The silicon-germanium layer 220 may be relaxed, either by a thermal anneal and/or during growth after the maximum meta-stable thickness is exceeded. During relaxation, misfit dislocations 222 and threading dislocations 224 are created. As shown in FIG. 4, two threading dislocations 224 are created for each misfit dislocation 222, and the threading dislocations 224 thread to a surface. In the silicon/silicon-germanium structure of FIG. 4, the threading dislocations 224 are typically at 60° angles since they glide on the Si (111) lattice plane. As is also shown in FIG. 4, because the bulk silicon substrate 210 tends to be unyielding, the relaxation tends to take place solely in the silicon-germanium layer 220 and hence the threading dislocations 224 propagate through the silicon-germanium layer 220. The threading dislocation density in the silicon-germanium layer 220 may be very high when the silicon-germanium layer 220 is relaxed. For example, assuming that 1% strain is created during the formation of the silicon-germanium layer 220, which is then completely relaxed, and assuming that each threading dislocation has a Burgers vector magnitude of approximately 5 Angstroms, then the threading dislocation density (TDD) may be calculated as follows:

$$TDD = 0.01 * 1 \text{ cm}/5 \text{ A} = 2 \times 10^5/\text{cm (unit length)} \quad (1)$$

This corresponds to a threading dislocation density of about $1 \times 10^{10}/\text{cm}^2$.

In many cases, the goal may be to form a strain-relaxed silicon-germanium layer that has a low threading dislocation density, so that strained device layers may thereafter be formed on the strain-relaxed silicon-germanium layer. Pursuant to embodiments of the inventive concepts, strain-relaxed silicon-germanium layers may be grown on silicon substrates under conditions where the threading dislocations will propagate through the silicon layer as opposed to the silicon-germanium layer. This may provide strain-relaxed silicon-germanium layers that have low threading dislocation densities.

In order to accomplish this, a sacrificial silicon layer may be grown on an underlying silicon layer such as, for example, a bulk silicon substrate. This sacrificial silicon layer may be a thin layer, so that it will not be unyielding as is the case with a bulk silicon substrate. Additionally, the sacrificial silicon layer may be formed so that the interface between the sacrificial silicon layer and the underlying silicon substrate may be weak so that the sacrificial silicon layer may move relative to the silicon substrate, as opposed to essentially becoming an extension of the silicon substrate. This weak interface may be accomplished, for example, by forming a porous region in the upper surface of the silicon substrate that will only weakly bond with the sacrificial silicon layer. Under these conditions, the strain in the silicon-germanium layer may be transferred during the relaxation process to the slippery interface between the sacrificial silicon layer and the silicon substrate, and hence the threading dislocations will flow through the sacrificial silicon layer instead of through the silicon-germanium layer.

FIG. 5A-5F are sectional diagrams that schematically illustrate a method of forming the semiconductor device 100' of FIG. 3 according to example embodiments of the inventive concepts.

Figure 5A:
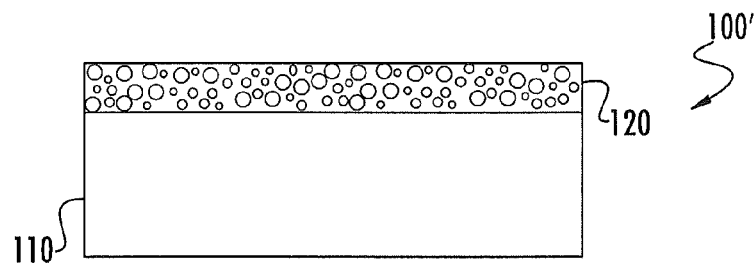
FIG. 5A-5F are sectional diagrams that schematically illustrate a method of forming a semiconductor structure that includes a strain-relaxed layer according to certain embodiments of the inventive concepts.

As shown in FIG. 5A, a silicon substrate 110 such as, for example, a bulk silicon substrate or a thick epitaxial grown silicon layer may be provided. A porous region 120 may be formed in a top surface of the silicon substrate 110. The porous region 120 may be formed on the entire top surface of the silicon substrate 110 or may be, for example, a pattern of porous areas that are formed in the top surface of the silicon substrate 110. In an example embodiment, the silicon substrate 110 may comprise a p-type silicon substrate and the top surface thereof may be converted into the porous region 120 by electro-chemical dissolution in a 40% hydrofluoric acid solution with a voltage drop applied between the wafer and the hydrofluoric acid solution to create an anodic reaction. The voltage drop may be selected to generate a current density of, for example, 1 microamp/cm² to set a pore creation rate of about 0.1 nm/second. In some embodiments, the porous region may have a porosity of about 30-60%, where porosity is defined as the volume of empty space in the porous region 120 divided by the total volume of the region 120. Different porosity values may be used, with a tradeoff involving ensuring that the porous region 120 has sufficient mechanical integrity while sufficiently weakening the shear forces bonding the silicon layer 130 to the porous region 120. The degree of porosity may also be selected to be low enough so that the surface pores may be readily closed in a subsequent processing step. The degree of porosity in the porous region 120 may be controlled, for example, by adjusting the current used for the reaction. The thickness of the porous region 120 may be varied as appropriate. In some embodiments, the porous region 120 may be a layer having a thickness of about 50-2000 nm.

With an n-type silicon substrate 110, the same wet etch technique that is described above may be used, and may be assisted by shining light on the substrate during the wet etching treatment. Photons from the light may act as a catalyst to increase the etch rate, which otherwise may tend to be slower in n-type silicon.

While a wet etch is one possible method for forming the porous region 120, it will be appreciated that other techniques may be used in further embodiments. For example, the porous region 120 may alternatively be formed by ion bombardment with, for example, electrically neutral ions such as nitrogen ($N_2$) or helium ($He_2$). Other techniques may also be used.

Once the porous region 120 is formed in the top surface of the silicon substrate 110, the pores in an uppermost portion of the porous region 120 may be closed by, for example thermally annealing the semiconductor structure 100' in hydrogen ($H_2$). The annealing temperature may be selected to be high enough to collapse the top surface of the porous region 120 via a reflow process, thereby enclosing at least some of the surface pores, but low enough to reduce a sintering effect that may tend to collapse the internal pores. In some embodiments, lower annealing temperatures may be used by performing an in situ chlorine ($Cl_2$) anneal on the porous region 120 prior to the hydrogen anneal. Closing the pores in the uppermost surface of the porous region may allow the porous region 120 to serve as a good seed layer during the subsequent growth of the silicon epitaxial layer 130. The hydrogen anneal may also facilitate removal of native oxides from the top surface of the porous region 120.

In some embodiments, the porous region 120 may have a high degree of porosity such as, for example, 50%. This high degree of porosity may weaken the shear strength between the porous region 120 and the subsequently grown silicon epitaxial layer 130.

Figure 5B:
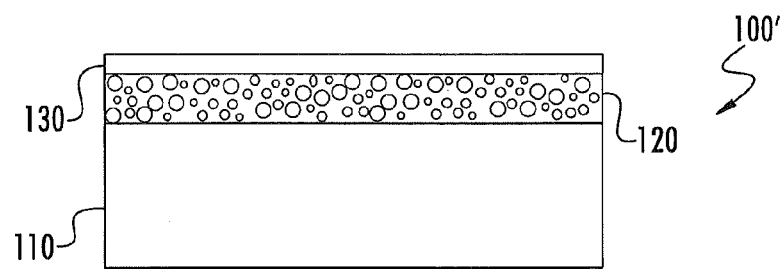

Referring to FIG. 5B, a thin silicon layer 130 may be epitaxially grown on the uppermost surface of the porous region 120 via, for example, chemical vapor deposition. The silicon layer 130 may be a thin layer having a thickness of, for example, 5-10 nm in some embodiments. The silicon layer 130 may have sufficient thickness to ensure that the pores in the porous region 120 are fully covered. Because of the weak shear strength between the porous region 120 and the thin silicon layer 130, the silicon layer 130 may behave like a thin membrane that may move relatively freely relative to the porous region 120 when a tensile stress is applied to the silicon layer 130. The silicon layer 130 is lattice-matched with the porous region 120 on which it is grown, and hence the silicon layer 130 may be a relaxed layer as grown.

Figure 5C:
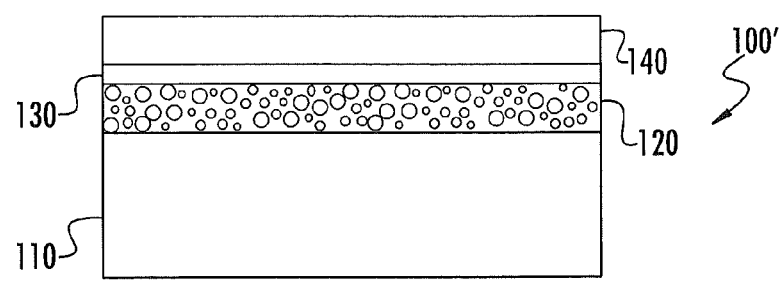

Referring to FIG. 5C, next a relatively thin first silicon-germanium layer 140 may be epitaxially grown on an upper surface of the thin silicon layer 130. The first silicon-germanium layer 140 may have a relatively high germanium concentration such as, for example, a germanium concentration of 50 percent or more in some embodiments (i.e., a $Si_{0.5}Ge_{0.5}$ layer). In some embodiments, the thickness of the first silicon-germanium layer 140 may be selected such that the first silicon-germanium layer 140 will be substantially completely strained as grown, have a low dislocation density, be thick enough so that it can transfer all of its strain energy to the silicon layer 130 during the relaxation step, and be thin enough to be relaxed via an annealing step. The first silicon-germanium layer 140 may be thicker than the silicon layer 130. In some embodiments, the first silicon-germanium layer may have a thickness of, for example, about 10-20 nm assuming a germanium concentration of about 40-60%. The thickness of the first silicon-germanium layer 140 may be varied based on a number of parameters including, for example, the germanium concentration thereof and the thickness of the underlying silicon layer 130. Optimum thicknesses may exist that reduce and/or minimize the threading dislocation density in the first silicon-germanium layer 140. The first silicon-germanium layer 140 is not lattice matched with the underlying silicon layer 130. Consequently, both the silicon layer 130 and the first silicon-germanium layer 140 may be fully strained as grown. Both the silicon layer 130 and the first silicon-germanium layer 140 may be substantially free of defects as grown in some embodiments.

Figure 5D:
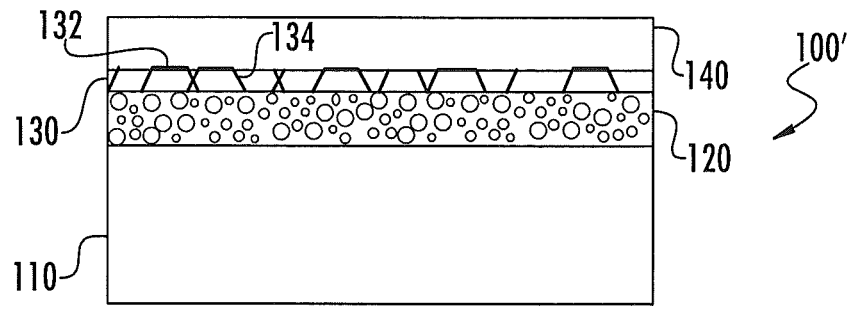

Referring to FIG. 5D, the semiconductor structure 100' may then be thermally annealed to relax the silicon layer 130 and the first silicon-germanium layer 140. This thermal anneal may be performed, for example, in situ in the epitaxial growth reactor. In an example embodiment, the semiconductor structure 100' may be annealed at a temperature of 800° C. for 0.5 to 30 minutes in a hydrogen environment. After this thermal anneal is completed, both the silicon layer 130 and the first silicon-germanium layer 140 may be relaxed. As grown (i.e., before the thermal anneal), the silicon layer 130 may be under tensile stress and first silicon-germanium layer 140 that is formed thereon may be under compressive stress. As shown in FIG. 5D, as these layers relax during the thermal anneal, misfit dislocations 132 may be formed along the interface between the silicon layer 130 and the first silicon-germanium layer 140. Layers that are under tensile stress may be more prone to threading dislocation formation. The silicon layer 130 reacts to the tensile stress from the first silicon-germanium layer 140 that is formed on top of it and completely relaxes to form a highly defective layer. In contrast, the first silicon-germanium layer 140 may relax with little or no defect formation as the strain is funneled into the underlying silicon layer 130. Consequently, the net result is that the threading dislocations 134 that may extend from each end of each misfit dislocation 132 may generally form in the silicon layer 130 and the first silicon-germanium layer 140 may have a reduced threading dislocation density or may even be substantially free of threading dislocations.

As discussed above, the silicon layer 130 may tend to behave akin to a floating membrane because the porous region 120 may have weak shear strength with the silicon layer 130 so that the porous region 120 is somewhat compliant or "slippery" with respect to the silicon layer 130. The silicon layer 130 may react to the tensile stress imparted onto it from the first silicon-germanium layer 140 above and may substantially completely relax with the threading dislocations formed therein as the relaxation occurs. The first silicon-germanium layer 140, on the other hand, may relax with reduced or minimal defect formation because the majority of the strain is funneled into the silicon layer 130 during the thermal anneal. Thus, the silicon layer 130 may act as a sacrificial layer that facilitates the growth of a reduced defect first silicon-germanium layer 140. If the weakened bonds were not provided, the silicon layer 130 would form a unitary structure with the underlying silicon substrate 110, and would appear as a relatively unyielding structure such the first silicon-germanium layer 140 would not be able to transfer strain to the silicon layer 130/silicon substrate 110 during the relaxation anneal.

Figure 5E:
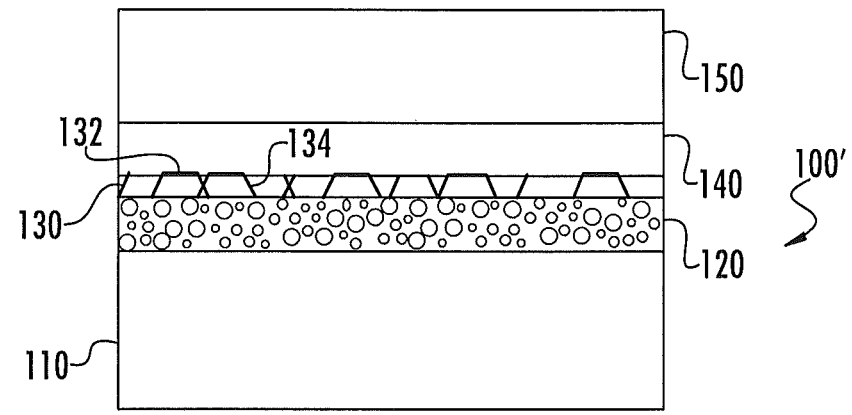

Referring to FIG. 5E, a second silicon-germanium layer 150 may then be epitaxially grown on an upper surface of the first silicon-germanium layer 140. The second silicon-germanium layer 150 may have a higher germanium concentration than the first silicon-germanium layer 140. In some embodiments, very high germanium concentrations may be included in the second silicon-germanium layer 150 such as, for example, germanium concentrations of 0.9 or higher (e.g., a Si$_{0.1}$Ge$_{0.9}$ layer). In fact, in some embodiments, the second silicon-germanium layer may be replaced with a pure germanium layer. The higher germanium concentration included in the second silicon-germanium layer 150 (or pure germanium layer 150) may impart a tensile stress to the lower germanium concentration first silicon-germanium layer 140 therebelow. The thickness of the second silicon-germanium layer 150 may again be selected such that the second silicon-germanium layer 150 will be substantially completely strained, have a low dislocation density, and yet be thick enough so that it can transfer all of its strain energy to the first silicon-germanium layer 140 during the relaxation step. In some embodiments, the second silicon-germanium layer may have a thickness on the order of, for example, about 20-40 nm. The thickness may be selected to be large enough so that the second silicon-germanium layer 150 may be capable of storing enough strain energy so that the first silicon-germanium layer 140 on which it is grown may be fully relaxed during a subsequent process step. The second silicon-germanium layer 150 may be thicker than the first silicon-germanium layer 140. The second silicon-germanium layer 150 is not lattice matched with the underlying first silicon-germanium layer 140 due to the higher germanium concentration. Consequently, the first and second silicon-germanium layers 140, 150 may be fully strained as grown. The second silicon-germanium layer 150 may be substantially free of defects as grown.

Figure 5F:
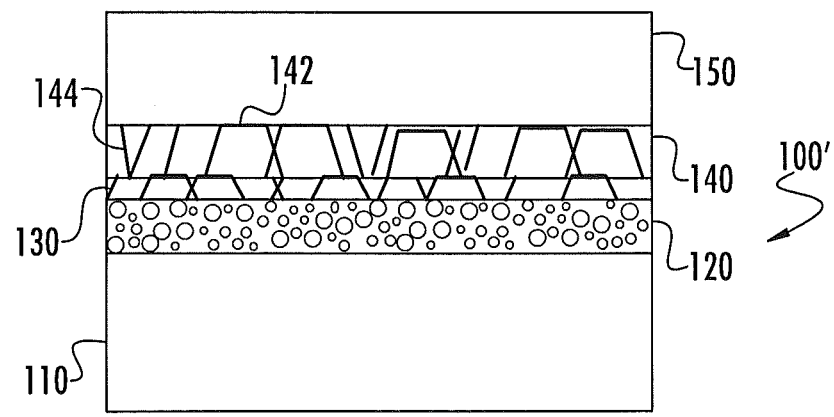

Referring to FIG. 5F, the semiconductor structure 100' may then be thermally annealed to relax the first and second silicon-germanium layers 140, 150. This thermal anneal may be performed, for example, in situ in the epitaxial growth reactor. In an example embodiment, the semiconductor structure 100' may be annealed at a temperature of about 800° C. for a period of 30 seconds to 30 minutes in a hydrogen environment. As shown in FIG. 5F, after this thermal anneal is completed, the first and second silicon-germanium layers 140, 150 may be relaxed. During the thermal anneal, the first silicon-germanium layer 140 may be under tensile stress and the second silicon-germanium layer 150 that is formed thereon may be under compressive stress. As these layers relax during the thermal anneal, misfit dislocations 142 may be formed along the interface between the first and second silicon-germanium layers 140, 150. The threading dislocations 144 may be prone to form in the first silicon-germanium layer 140 because of the tensile stress and the second silicon-germanium layer 150 may have a reduced threading dislocation density or may even be substantially free of threading dislocations. The second silicon-germanium layer 150 may be used as a seed layer for the subsequent formation of thicker silicon-germanium or germanium layers or, alternatively, may be used as a seed layer for one or more semiconductor layers that serve as active regions for various semiconductor devices.

In some embodiments, the total thickness of the silicon layer 130 and the first and second silicon-germanium layers 140, 150 may be less than about 50-100 nm. This may be orders of magnitude thinner than strain-relaxed silicon-germanium layers grown on bulk silicon wafers using conventional graded growth techniques (which may be tens or hundreds of microns thick). In addition, the strain-relaxed silicon-germanium layer 150 may have a very high germanium concentration, low dislocation densities, and may be grown on, for example, a conventional bulk silicon substrate without the need to use more costly silicon-on-insulator substrates.

The high germanium concentration, low defect strain-relaxed silicon-germanium layers formed according to embodiments of the inventive concepts may be used to enable a variety of different technologies such as, for example, SiGe-CMOS technology n-type silicon/p-type germanium systems or SiGe-CMOS technology n-type germanium/p-type germanium systems. These technologies may be implemented on a common silicon substrate.

As noted above, the porous region 120 may be formed across the entire top surface of the silicon substrate 110, and then a thin silicon layer 130 followed by a series of one or more silicon-germanium layers 140, 150 may be grown thereon, where the silicon-germanium layers 140, 150 may have increasing germanium concentrations with a top silicon-germanium layer having a desired germanium concentration. After this final (top) silicon-germanium layer is formed, a mask layer may be formed on the top surface of the semiconductor structure and the structure may be etched to remove portions of the series of silicon-germanium layers from selected areas of the structure, thereby exposing the silicon layer (or alternatively, portions of the silicon substrate under the porous regions). Then silicon layers may be epitaxially grown in some or all of the regions where the silicon-germanium layers were removed, thereby providing a structure that has both silicon regions and high germanium concentration silicon-germanium regions (or pure germanium regions) that are formed on the same bulk silicon substrate.

It is believed that the techniques according to embodiments of the inventive concept can provide medium germanium concentration (e.g., germanium concentration of 40-75%) or high germanium concentration (e.g., germanium concentrations of 75% to 100%) silicon-germanium layers on a standard bulk silicon substrate that have threading dislocation densities of less than $1\times10^6/cm^2$ or even less than $1\times10^5/cm^2$ or $1\times10^4/cm^2$.

Embodiments of the present inventive concepts may take advantage of the imbalance in strain energy between two different semiconductor materials. For example, consider the material system 300 shown in FIG. 6A, in which a 3 nm thick silicon-germanium layer 320 having a germanium concentration of 50% is epitaxially grown on a 3 nm thick silicon layer 310. Here, the stress caused by the lattice-mismatch should equalize in this bilayer structure with opposite signs, namely the silicon-germanium layer 320 will be under compressive stress and the silicon layer 310 will be under tensile stress. In this situation, threading dislocations are unlikely to form in the silicon-germanium layer 320 during a relaxation anneal as the silicon-germanium layer 320 is under compressive stress. Whether threading dislocations will form in the silicon layer 310 is hard to predict.

Figure 6A:
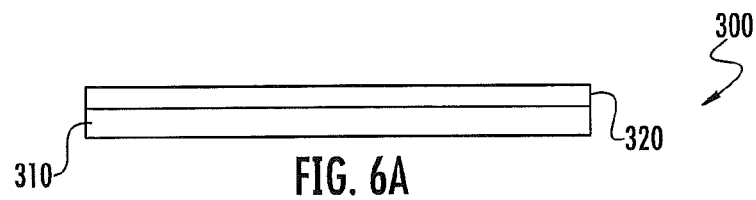
FIG. 6A is a schematic sectional diagram illustrating a thin silicon-germanium layer grown on a thin silicon layer.
Figure 6B:
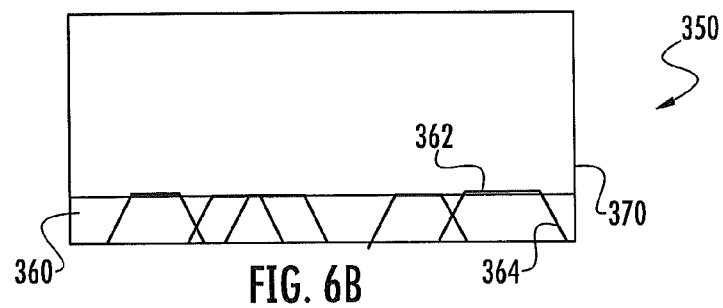
FIG. 6B is a schematic sectional diagram illustrating a thicker silicon-germanium layer grown on a thin silicon layer.

As shown in FIG. 6B, the situation illustrated in FIG. 6A may be modified so that a 30 nm thick silicon-germanium layer 370 having a germanium concentration of 50% is epitaxially grown on a 10 nm thick silicon layer 360. In this case, the strain energy of the thicker silicon-germanium layer 370 will be forced into the thinner silicon layer 360 that is under tensile stress to create misfit dislocations 362 at the interface between the two layers and threading dislocations 364 that extend into the silicon layer 360, thereby relaxing the silicon-germanium layer 370. FIG. 6B thus illustrates a mechanism that may be used to direct the threading dislocations 364 downwardly into the silicon layer 360. However, to accomplish this, a thin silicon layer 360 is needed that may be placed under tensile stress by the silicon-germanium layer 370. As discussed above, in some embodiments, this may be accomplished by growing the silicon layer 360 on a porous region of a silicon substrate so that the silicon layer may act like a thin membrane that floats on the substrate.

Pursuant to further embodiments of the inventive concepts, a bottom surface of the thin silicon layer that is grown on the silicon substrate may be made "slippery." This may be done in place of forming the porous region in the top surface of the silicon substrate or may be done in addition to forming the porous region. In some embodiments, the bottom surface of the silicon layer may be grown at a low temperature to form highly defective silicon that may not bond well with the silicon substrate. The remainder of the silicon layer may be grown at higher temperatures in an effort to limit the defects to the bottom portion of the thin silicon layer.

It will be appreciated that while the above described embodiments provide example in which one (FIG. 2) or two (FIGS. 3 and 5A-5F) silicon-germanium layers are formed on a silicon substrate, in other embodiments, greater numbers of silicon-germanium layers may be formed. For example, in another embodiment, a first $Si_{0.7}Ge_{0.3}$ layer may be formed on a thin silicon layer, then a second $Si_{0.4}Ge_{0.6}$ layer may be formed on the $Si_{0.3}Ge_{0.3}$ layer, and then a $Si_{0.1}Ge_{0.9}$ layer may be formed on the $Si_{0.4}Ge_{0.6}$ layer. This "tri-layer" approach may (1) help ensure that silicon-germanium layers that have thicknesses less than the maximum meta-stable thickness may be grown and (2) may exhibit lower defect levels due to the closer lattice match between adjacent layers. It will be appreciated that the germanium concentrations of each layer may be varied from those cited in the above example, that the number of layers may be extended beyond three, and/or that the same approach may be used in lattice mismatched material systems other than silicon/silicon-germanium material systems.

Figure 7:
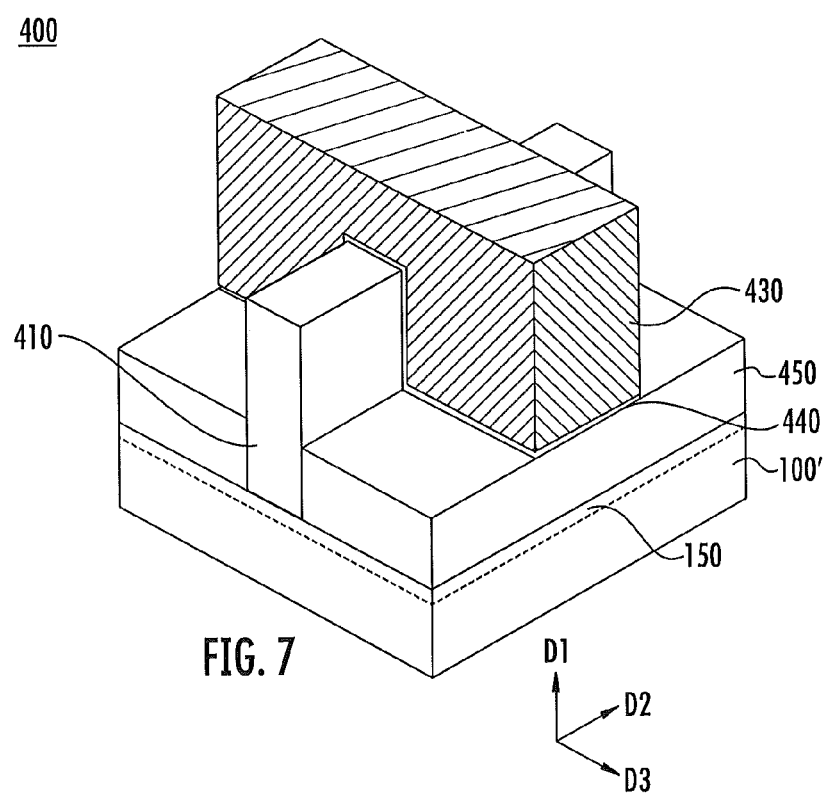
FIG. 7 is a perspective diagram of a semiconductor device that includes a strain-relaxed layer according to embodiments of the inventive concepts.

One application for which the devices formed according to embodiments of the inventive concepts may be particularly useful is in the formation of germanium fins for FIN-FET transistors. The maximum height of the germanium fin than can be grown relatively defect-free is a function of the germanium concentration of the underlying strain-relaxed silicon-germanium layer. For example, a completely relaxed and defect-free $Si_{0.3}Ge_{0.3}$ strain-relaxed layer can have less than 10 nm of a defect-free germanium fin grown thereon. This fin height may be insufficient to support desired integration densities. In contrast, a completely relaxed and defect-free $Si_{0.1}Ge_{0.9}$ strain-relaxed layer can support more than 100 nm of a defect-free germanium fin grown thereon. This fin height may support significantly higher integration densities. Thus, the ability to grow a relatively defect-free very high germanium concentration strain-relaxed silicon-germanium layer using the techniques according to embodiments of the inventive concepts may be particularly useful for this application. FIG. 7 is a perspective view illustrating a fin field effect transistor 400 that may be grown on the semiconductor structures such according to some embodiments of the inventive concepts, such as semiconductor structures 100 and 100' of FIGS. 2-3.

Referring to FIG. 7, the fin field effect transistor 400 includes a fin body 410 that protrudes from the upper surface of the semiconductor structure 100' in a first direction D1. The fin body 410 may be formed on the second silicon-germanium layer 150 of semiconductor 100' (or a semiconductor layer formed above the silicon-germanium layer 150, which is not shown in FIG. 7), which may have, for example, a germanium concentration of 90% (or may even be a pure germanium layer, as discussed above). The fin body 410 may be the same semiconductor material as the upper surface of the semiconductor structure 100', and hence in this embodiment may also be a silicon-germanium layer having a germanium concentration of 90%. Thus, the fin body 410 may be lattice matched with the underlying semiconductor structure 100'. The fin body 410 may extend longitudinally in a second direction D2 that is perpendicular to the first direction D1. A lower sidewall of the fin body 410 may be covered by a device isolation layer 450, whereas upper side walls of the fin body 410 may be exposed.

A gate electrode 430 that extends in a third direction D3 that is perpendicular to both the first and second directions D1 and D2 is disposed on, and crosses over, the fin body 410. The gate electrode 430 surrounds the top surface and both upper sidewalls of the fin body 410. The gate electrode 430 may be a metal layer. A gate insulating layer 440 may be disposed between the gate electrode 430 and the fin body 410. The gate insulating layer 440 may be a metal oxide layer having a dielectric constant higher than that of silicon oxide. Source/drain regions doped with dopants may be disposed in the fin body 410 at both sides of the gate electrode 430.

The portion of the fin body 410 that is covered by the gate electrode 430 may correspond to a channel region.

Figure 8:
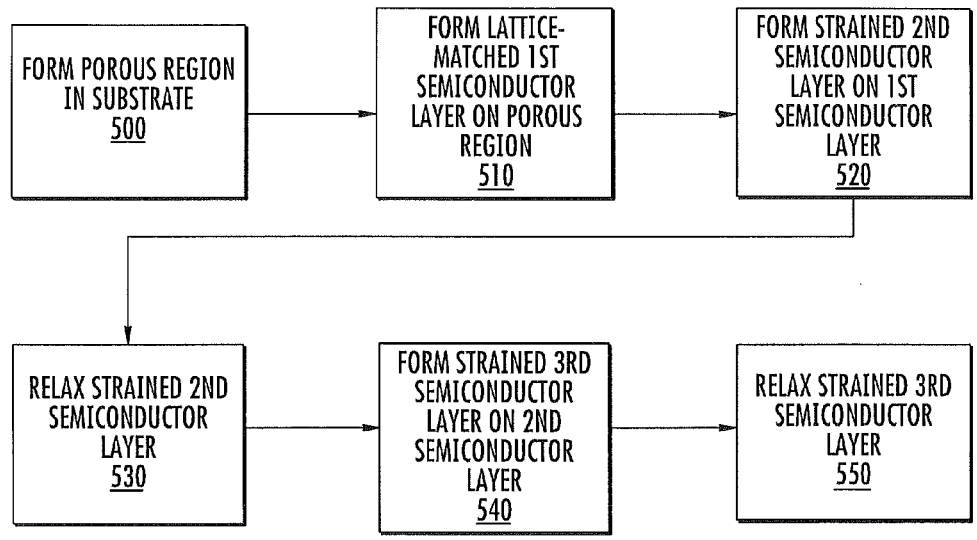
FIG. 8 is a flow chart of a method of forming a strain-relaxed layer according to certain embodiments of the inventive concepts.

FIG. 8 is a flow chart of a method of forming a strain-relaxed layer according to certain embodiments of the inventive concepts. As shown in FIG. 8, pursuant to these methods, a porous region may be formed in a surface of a semiconductor substrate (block 500). A semiconductor layer that is lattice-matched with the semiconductor substrate may then be formed on the porous region of the semiconductor substrate (block 510). Next, a second semiconductor layer that is lattice-mismatched with the first semiconductor layer may be formed on the first semiconductor layer (block 520). The second semiconductor layer may be strained as grown. Then the second semiconductor layer may be relaxed by a relaxation process such as, for example, a thermal anneal (block 530). A third semiconductor layer that is lattice-matched with the second semiconductor layer may then optionally be formed on the second semiconductor layer (block 540). The third semiconductor layer may be strained as grown. Then the third semiconductor layer may be relaxed by a relaxation process such as, for example, a thermal anneal (block 550).

Figure 9:
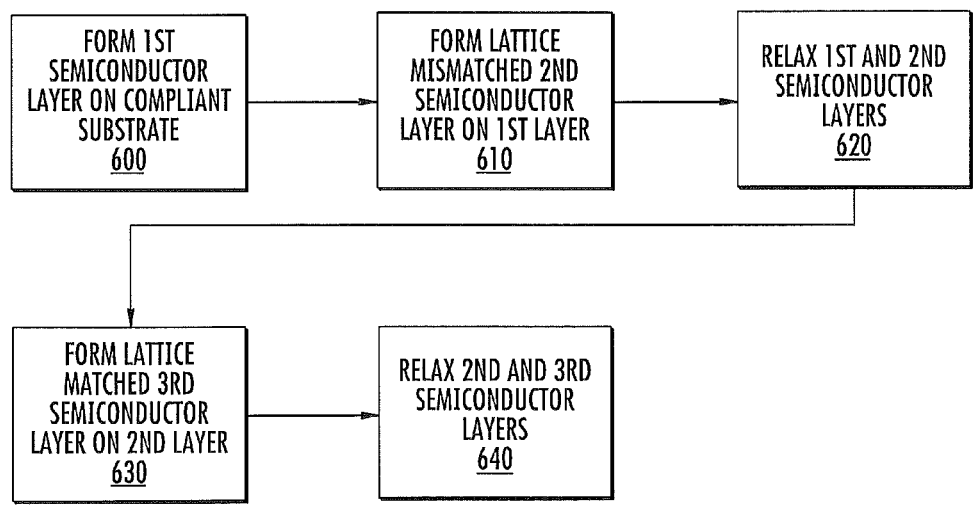
FIG. 9 is a flow chart of a method of forming a strain-relaxed layer according to further embodiments of the inventive concepts.

FIG. 9 is a flow chart of a method of forming a strain-relaxed layer according to further embodiments of the inventive concepts. As shown in FIG. 9, pursuant to these methods, a first semiconductor layer that is lattice-matched with a compliant semiconductor substrate may be formed on the compliant semiconductor substrate (block 600). Next, a second semiconductor layer that is lattice-mismatched with the first semiconductor layer may be formed on the first semiconductor layer (block 610). The first and second semiconductor layers may then be relaxed by a relaxation process such as, for example, a thermal anneal (block 620). A third semiconductor layer that is lattice matched with the second semiconductor layer may then optionally be formed on the second semiconductor layer (block 630). The second and third semiconductor layers may then be relaxed by a relaxation process such as, for example, a thermal anneal (block 640).

Thus pursuant to embodiments of the inventive concepts, strain relaxed silicon germanium layers may be formed on a lattice mismatched bulk silicon substrate where the strain-relaxed silicon-germanium layer (1) may have a high germanium concentration and (2) may be relatively free of threading dislocations. These strain-relaxed buffer layers may be formed to have a relatively small total thickness such as, for example, a thickness of less than 100 nm or even a thickness of less than 50 nm. The strain-relaxed layers may be formed very cost effectively on conventional bulk silicon substrates using conventional chemical vapor deposition epitaxial growth processes that are appropriate for high volume manufacturing.

Herein the threading dislocation density is defined as the number of dislocations per square centimeter. It will be appreciated that threading dislocation densities can be measured in a number of ways, including, for example, measuring etch pit density, TEM, plane-view TEM and HR-XRD.

While the inventive concept has primarily been discussed above with reference to embodiments in which one or more strain-relaxed silicon-germanium layers are formed on a silicon substrate, it will be appreciated that the techniques disclosed herein may be used in a wide variety of material systems. For example, in other embodiments, a strain-relaxed III-V compound semiconductor layers may be grown using the techniques disclosed herein such as, for example, the growth of strain relaxed $In_xGa_{1-x}As$ layers on GaAs, the growth of strain-relaxed GaAs layers on silicon substrates, and/or the growth of short wavelength II-VI or long-wavelength III-V laser structures on GaAs substrates. Additionally, it will be appreciated that the techniques used herein may be used not only to provide strained channel layers for semiconductor devices that exhibit higher carrier mobilities, but also for other purposes such as for changing the bandgap of a semiconductor material for optical purposes.

Embodiments of the inventive concepts have been described above with reference to the accompanying drawings, in which example embodiments are shown. The inventive concepts may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the drawings and specification. As used herein the expression "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "coupled to" or "connected to" or "on" another element, it can be directly coupled to, connected to or on the other element or intervening elements may also be present. In contrast, when an element is referred to as being "directly coupled to" or "directly connected to" or "directly on" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, elements, and/or components, but do not preclude the presence or addition of one or more other features, elements, components, and/or groups thereof.

Embodiments of the inventive concepts have been described above with reference to cross-section illustrations that are schematic illustrations of idealized embodiments (and intermediate structures) of the inventive concepts. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

All embodiments can be combined in any way and/or combination.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A strain-relaxing method, comprising:
forming a porous region in a surface of a semiconductor substrate;
forming a first semiconductor layer that is lattice matched with the semiconductor substrate on the porous region in the surface of the semiconductor substrate;
forming a second semiconductor layer on the first semiconductor layer, the second semiconductor layer being a strained layer as formed; and
relaxing the second semiconductor layer; and
forming a third semiconductor layer directly on the relaxed second semiconductor layer, the third semiconductor layer being a strained layer as formed; and
relaxing the third semiconductor layer,
wherein the second semiconductor layer comprises a first silicon-germanium layer and the third semiconductor layer comprises a second silicon-germanium layer.

2. The method of claim 1, wherein forming the porous region in the surface of the semiconductor substrate comprises wet etching a top surface of the semiconductor substrate using a wet etchant with an electrical potential applied between the semiconductor substrate and the wet etchant.

3. The method of claim 1, wherein before the second semiconductor layer is relaxed, the first semiconductor layer is under tensile stress and the second semiconductor layer is under compressive stress.

4. The method of claim 1, wherein the first semiconductor layer is only weakly bonded to the semiconductor substrate so that the first semiconductor layer may move with respect to the semiconductor substrate when a tensile stress is applied to the first semiconductor layer.

5. The method of claim 1, wherein the first semiconductor layer is formed directly on the porous region in the surface of the semiconductor substrate, and the second semiconductor layer is formed directly on the first semiconductor layer.

6. The method of claim 1, wherein the semiconductor substrate comprises a silicon substrate, the first semiconductor layer comprises a silicon layer, the first silicon-germanium layer has a first germanium concentration, and the second silicon-germanium layer has a second germanium concentration that exceeds the first germanium concentration.

7. The method of claim 6, wherein the second germanium concentration of the second silicon-germanium layer exceeds 75 percent and a threading dislocation density in the second silicon-germanium layer is less than about $1 \times 10^5/cm^2$.

8. The method of claim 6, wherein a total thickness of the silicon layer, the first silicon-germanium layer and the second silicon-germanium layer is less than 75 nm.

9. The method of claim 1, further comprising:
forming a fourth semiconductor layer on the second semiconductor layer opposite the semiconductor substrate; and
forming a semiconductor device at least partly in or on the fourth semiconductor layer.

10. A method of forming a strain-relaxed semiconductor layer, the method comprising:
forming a first semiconductor layer on top of a compliant region of a semiconductor substrate that is lattice-matched with the first semiconductor layer so that the first semiconductor layer is only weakly bonded to the compliant region of the semiconductor substrate and may move laterally on the top surface of the compliant region of the semiconductor substrate;
forming a second semiconductor layer that is lattice-mismatched with the first semiconductor layer on the first semiconductor layer;
performing a relaxation process on the second semiconductor layer that generates threading dislocations in the first semiconductor layer while leaving the second semiconductor layer substantially free of threading dislocations.

11. The method of claim 10, further comprising:
forming a third semiconductor layer that is lattice-mismatched with the second semiconductor layer directly on the second semiconductor layer; and
performing a relaxation process on the third semiconductor layer that generates threading dislocations in the second semiconductor layer while leaving the third semiconductor layer substantially free of threading dislocations.

12. The method of claim 11, wherein the first semiconductor layer is under tensile stress prior to relaxation and the second semiconductor layer is under compressive stress prior to relaxation.

13. The method of claim 11, wherein the compliant region of the semiconductor substrate comprises a porous region in a top surface of a silicon substrate, the first semiconductor layer comprises a silicon layer, the second semiconductor layer comprises a first silicon-germanium layer having a first germanium concentration, and the third semiconductor layer comprises a second silicon-germanium layer having a second germanium concentration that exceeds the first germanium concentration.

14. The method of claim 13, wherein the second germanium concentration of the second silicon-germanium layer exceeds 75 percent and a threading dislocation density in the second silicon-germanium layer is less than about $1 \times 10^5/cm^2$.

15. The method of claim 14, wherein a total thickness of the silicon layer, the first silicon-germanium layer and the second silicon-germanium layer is less than 75 nm.

16. The method of claim 13, wherein the porous region has a porosity of at least 30%.

17. The method of claim 10, wherein forming the first semiconductor layer on top of the compliant region of the substrate that is lattice-matched with the first semiconductor layer so that the first semiconductor layer is only weakly bonded to the compliant region of the semiconductor substrate and may move laterally on the top surface of the compliant region of the semiconductor substrate comprises:
forming a porous region in a top surface of a semiconductor substrate and then heating the semiconductor substrate to close at least some of the surface pores while leaving the interior of the porous region porous to convert the a region of the semiconductor substrate into the compliant region of the semiconductor substrate; and then
epitaxially growing the first semiconductor layer on the porous region by chemical vapor deposition.

18. A method of forming a semiconductor device, the method comprising:
forming a porous region in a top surface of a silicon substrate;
forming a silicon layer on a top surface of the porous region in the top surface of the silicon substrate;
forming a first silicon-germanium layer that has a first germanium concentration on a top surface of the silicon layer;
relaxing the first silicon-germanium layer;
forming a second silicon-germanium layer that has a second germanium concentration that is higher than the first germanium concentration directly on a top surface of the relaxed first silicon-germanium layer, the second silicon-germanium layer being a strained layer as formed;
relaxing the second silicon-germanium layer;
forming a semiconductor layer on a top surface of the second silicon-germanium layer; and
forming the semiconductor device at least partly in the semiconductor layer.

19. The method of claim 18, wherein forming the porous region in the surface of the silicon substrate comprises wet etching the top surface of the silicon substrate using a wet etchant with an electrical potential applied between the silicon substrate and the wet etchant, the method further comprising annealing the silicon substrate to close at least some of the pores in the top surface of the porous region prior to forming the first silicon-germanium layer.

* * * * *